(12) United States Patent
Schlapp et al.

(10) Patent No.: US 7,603,243 B2
(45) Date of Patent: Oct. 13, 2009

(54) METHOD AND ERROR LOCATION IN BRANCHED LOW VOLTAGE AND MEDIUM VOLTAGE NETWORKS AND EVALUATION CIRCUIT USED THEREOF

(75) Inventors: Hubert Schlapp, Ebern (DE); Frieder Jehring, Pirna (DE)

(73) Assignee: Seba-Dynatronic Mess-und Ortungstechnik GmbH, Baunach (DE)

( * ) Notice: Subject to any disclaimer, the term of this patent is extended or adjusted under 35 U.S.C. 154(b) by 672 days.

(21) Appl. No.: 10/484,585

(22) PCT Filed: Jul. 24, 2002

(86) PCT No.: PCT/EP02/08239

§ 371 (c)(1),
(2), (4) Date: Jul. 15, 2004

(87) PCT Pub. No.: WO03/012466

PCT Pub. Date: Feb. 13, 2003

(65) Prior Publication Data

US 2004/0245994 A1 Dec. 9, 2004

(30) Foreign Application Priority Data

Jul. 26, 2001 (DE) ............................ 101 36 344

(51) Int. Cl.
*G01R 31/00* (2006.01)
(52) U.S. Cl. .................... 702/59; 702/64; 702/75; 361/67; 324/528; 324/654
(58) Field of Classification Search ............. 702/57–60, 702/64–66, 75–78, 106, 117, 124; 324/512, 324/525, 527, 528, 654, 708; 361/64, 66, 361/67

See application file for complete search history.

(56) References Cited

U.S. PATENT DOCUMENTS 4,568,872 A * 2/1986 Heller et al. ................ 324/522

FOREIGN PATENT DOCUMENTS

EP 1412767 7/2001

OTHER PUBLICATIONS

"Brockhaus der Naturwissenschaft und Technik" issued in the year 1951, p. 133 "Elektrische Schwingungen".
"Brockhaus Enzyklopädie", book No. 5, issued in the year 1968, p. 422+423 "Elektromagnetische Schwingungen".
Physik für Ingenieure, issued in the year 1979, where you can find the formula on p. 291, formula No. 291.1.
"Taschenbuch der Physik", issued in the year 1981, where you can find the formula on p. 463 and 500, formula No. E32.18 and E34.6.

* cited by examiner

*Primary Examiner*—Manuel L Barbee
(74) *Attorney, Agent, or Firm*—Cooper & Dunham LLP (57) ABSTRACT

The invention relates to a method for error location in branched low voltage and medium voltage networks and to an evaluation network used therefor. The inventive method consists of the following steps: initially, the frequency of the low-frequency component of the impulse wave current or voltage is determined; the circuit inductance is calculated, using a Thomson resonant circuit formula, from the determined low-frequency transient frequency with the known capacitance of the impulse capacitor; the inductance of the impulse capacitor and the measuring line is deducted as a correction factor; finally the distance from the place of error in the cable is calculated from the inductance thus calculated on the basis of the inductance of the measured object, the advantage thereof being that it is possible to located voltage-dependent cable errors in a branched low-voltage or medium voltage network by means of length determination in a quick and error-free manner without signal reflections causing disturbances on branches or end points of the cable. The evaluation circuit is provided with a conditioning and protection component, an A/D converter and at least one memory unit, in addition to an evaluation computer for the signal.

28 Claims, 6 Drawing Sheets

METHOD AND ERROR LOCATION IN BRANCHED LOW VOLTAGE AND MEDIUM VOLTAGE NETWORKS AND EVALUATION CIRCUIT USED THEREOF

The invention relates to a method for fault tracing in branching low-voltage and medium-voltage networks and to an evaluation circuit which is used for this purpose, as claimed in the precharacterizing clauses of the independent patent claims. In this case, the expression voltage network means electrical cables with one or more branches.

A method such as this is known, for example, as the current impulse method.

For simplicity, the following description refers to only one cable network, although, to be more precise, this means a low-voltage network or a medium-voltage network.

Low-voltage network systems such as these are prior art for the distribution of energy between transformer stations and domestic installations. The expression cable network is therefore generally used with reference to these networks.

However, the invention also relates to fault tracing on branching medium-voltage networks. This is the higher-level cable network level, with operating voltages of more than 5 kV.

Until now, the so-called current impulse method has been used for fault tracing in cable networks such as these.

In this case an impulse wave generator was connected to the feed point of the cable network, and the cable network was briefly charged by discharging the impulse capacitor in the impulse wave generator, causing a flashover at the cable fault.

The current impulse method which is used has the characteristic feature that a high-pass current coupler is used in order to record the transient components of the transient process. However, this has the disadvantage that each branch in the cable network being investigated produces a reflection signal in the transient component. This therefore results in a curve which is virtually impossible to evaluate, since all of the branches and end points produce a reflection signal in the curve to be evaluated.

In principle, the following procedure can be adopted for this purpose:

Cable Fault Types

There are various types of fault in cable systems such as parallel and series faults. In this case, parallel faults are of particular interest, with regard to which a distinction should also be drawn between permanent, intermittent and flashover faults. Permanent faults result in a parallel resistance between the cable conductors, and can be identified by a resistance measurement. Flashover faults are characterized in that they occur only when a (relatively high) voltage is applied. When no voltage is present, they cannot be verified by measurement.

TDR (Time Domain Reflection)

TDR (time domain reflection) comprises a conventional method for tracing fault locations in a cable. A fault causes an impedance change in the cable, and the pulses which the TDR transmits are reflected back on the impedance changes to the TDR. The distance can be calculated from the time at which the reflections arrive. The TDR method is also used in conjunction with high-voltage capacitor discharges in order to identify flashover faults. The capacitor discharge triggers the fault, and the position of the burning arc is then measured using the TDR.

Impulse Current Method (ICE=Impulse Current Equipment)

A capacitor is charged to a voltage which is higher than the response voltage of a fault. The capacitor is discharged via a switch to the cable, and the fault flashes over. The capacitor energy results in a transient oscillation in the cable. The appliance for producing these capacitor discharges is referred to as an impulse wave generator (SWG). In the impulse current method, the high-frequency periodic component of the transient oscillation signal is output via a high-pass current coupler, and is stored by means of a transient recorder. The periodicity of this signal corresponds to the distance between the connecting point and the fault location. The time interval between the period-ically recurring reflections is measured. The distance must be determined from the time measured in this way and from the propagation velocity, which is typical of the cable. If there are other reflection points than the cable fault in the cable profile, then these reflection points also lead to visible, different periodicities, which make the evaluation process more difficult. Reflection points such as these include, for example, branches to spur cables or changes in the cable type (3-phase, single-phase or larger cross-section change).

Branching NSP Networks

In Europe, the low-voltage distribution networks are designed such that a 3-phase main cable is laid in the roadway and a branch leads to each house. This means that there are a large number of branching cables in the main cable.

All of these branches can be seen as principal reflections, both in the TDR method and in ICE. In addition, the capability to evaluate the graphs is also reduced by this, since the spur lines cause reflections at their ends, which are then also passed back again to the main line and are thus visible in the graph.

It is therefore difficult to evaluate graphs for cable systems having a large number of branches, and discrepancies can generally be identified only by comparison of the faulty phase with a sound phase.

The invention is based on the object of developing a method of the type mentioned initially such that rapid and error-free cable fault tracing can be carried out even in a branching low-voltage or medium-voltage network.

In order to achieve the stated object, the invention is characterized by the following method steps:

1. In a first method step, the frequency of the low-frequency component of the impulse wave current or voltage is first of all determined.

2. In a second method step, the circuit inductance is calculated by means of the "Thomson's resonant circuit formula" using the known capacitance of the impulse capacitor from the determined, low-frequency transient frequency.

3. In a third method step, the self-inductance of the impulse capacitor and of the measurement line is subtracted, as a correction factor.

4. In a fourth method step, the distance to the fault location of the cable fault is calculated from the calculated inductance and on the basis of the inductance of the measurement object.

The stated technical teaching thus proposes an indirect method for determining the length to a fault location of a voltage-dependent fault. This is a major advantage in comparison to the prior art, because the reflection which is produced by each branch or each end point now need no longer be included in the evaluation process.

In the new method (low-voltage fault tracing), for branching cable systems, a different component of the impulse current method, which is known per se, is evaluated. Instead of filtering the high-frequency component, the damped harmonic, which is otherwise suppressed, is recorded. While the high-frequency or transient components reflect the profile of the impedance in the cable, the only critical factor governing the formation of the harmonic is the capacitance of the impulse capacitor plus the cable capacitance and the inductance of the cable as far as the fault location. The harmonic obtained in this way is a damped sinusoidal oscillation and is independent of further reflection points in the cable profile.

This signal waveform is highly suitable for simple numerical evaluation. Instead of using the impulse propagation velocity in the cable as is used for TDR and ICE, the inductance of the measured cable (or of the conductor pair) must be used to convert the measured frequency to the fault distance. However, the method is not restricted to branching low-voltage networks and can advantageously be used for any branching cable structure and, of course, also works on cables without branches.

Data Recording and Evaluation—(Conversion of L Instead of V/2)

The measurement recording of the NSP_SPG signal is simple. The design of the impulse generator depends on the application, but the cable capacitance can be ignored during this process, since it is very much smaller than the capacitance of the impulse capacitor. Only the damped transient signal from the current (or from the voltage) is recorded at the output of the impulse generator. Owing to the large capacitor, the oscillation frequency is between a few hundred Hertz and the low kilohertz range.

After conditioning and protection, the signal is recorded by means of an A/D converter, and is stored in a memory. The transient memory may be in the form of a ring memory. The initiation of the impulse results in a trigger signal being produced which stops the data recording process after a delay time. However, it is also possible to start the storage process only once the trigger event has been identified.

The inductance is calculated from the measured oscillation frequency. The capacitance of the impulse capacitor is measured and stored during production of the appliance. After subtraction of the equipment's own inductances, including those of the connecting line, this results in the inductance of the measurement object as far as the fault location. This can then be converted to the fault distance by means of tabular values for the inductance of the measurement object.

If the main cable comprises a number of different cable types, then it is necessary to include the lengths of the individual sections and the cable type. The appliance can then calculate the section inductances, and can thus associate a fault location with the correct section.

The appliance's self-inductance can be determined by a calibration measurement with a short circuit at the end of the measurement lines, using the same measurement electronics, and can likewise be stored as a correction value in the appliance.

Algorithms

For evaluation of the oscillation frequency, it is possible to simply measure the intervals between the zero crossings or the extreme values manually. However, automatic numerical evaluation is provided in order to improve the evaluation confidence and to improve the user convenience.

The following algorithms should be used for this purpose:
FFT (Fast Fourier Transform) and/or CZT (Chirp-Z transformation) for determination of the oscillation frequency. Determination of the maximum in the FFT (CZT) representation Determination of the voltage zero crossings in order to check the oscillation frequency (fault identification during the evaluation process)

Low-pass filtering of transient components

Continuity check of the signal in order to identify spurious elements and intermittently burning fault arcs Determination of the circuit Q-factor from the amplitude attenuation in order to assess the arc quality Identification of ground faults (flashover to ground) from the signal, and derivation of a safety warning for the user Exceptional treatment of signals subject to interference or signals with high attenuation.

The advantages of the invention are justified by the following features:

A fault-tracing method which is independent of the reflections from branches. A fault-tracing method which allows automatic numerical evaluation.

Evaluation which identifies flashovers to ground and warns the user of dangers.

Determination of the fault distance by calculation of the inductance of the measurement object and use of the typical inductance of the item under test.

Measurement of the fault distance by determination of the frequency of the transient oscillation and calculation of the external inductance.

Measurement of the frequency by determination of the time intervals between the zero crossings.

Measurement of the frequency by formation of the FFT transform (Chirp-Z transform) of the transient oscillation signal.

As a secondary aspect of the invention, frequency correction for the so-called "low Q-factor" of the resonant circuit, an extension to the method of numerical evaluation according to the invention, and separation of the impulse wave capacitor from the cable capacitance will be described in the following text. The method for fault tracing and the evaluation circuit for this purpose according to the invention are not, however, associated with these extensions, so that these are claimed only as a function of the features of the independent claims.

Frequency Correction for a Low Q-Factor

When the resonant circuit Q-factors are low, as may occur in the case of low-voltage cables with a small cross section (less than 95 mm.sup.2) and when the impulse capacitor capacitances are high (greater than 100 .mu.F) there is a fundamental shift in the measurable transient frequency (f) with respect to the frequency (fo) which can be determined by means of the Thomson's resonant circuit formula. The discrepancy of the measured frequency can be determined as a function of the Q-factor using equation (4).

$$\frac{f}{fo} = \frac{1}{\sqrt{1 + \frac{1}{4Q^2}}} \tag{4}$$

The corrected value of the line inductance of interest can thus be calculated by means of equation (5), with the known impulse capacitor Cs.

$$L_c = \frac{1}{\omega^2 C_s \left(1 + \frac{1}{4Q^2}\right)} \tag{5}$$

$$\omega = 2\pi f$$

The Thomson frequency fo (or period duration) can, of course, likewise be calculated with the aid of equation (4), with the line inductance then being calculated in steps, as explained in the document DE 10136344.3.

The invention thus comprises the additional determination of the Q-factor of the transient process, which can be used to correct the calculation of the line inductance.

The Q-factor may, for example, be determined from the drop in the amplitudes between successive oscillations of the exponentially decaying transient process, by means of equation (6)

$$Q = -\frac{n*\pi}{\ln\left(\frac{U(tn)}{U_o}\right)} \quad (6)$$

Uo is the initial amplitude and U(tn) is the amplitude of the nth oscillation.

Other methods may also be used to determine the Q-factor and, for example, it is also possible to use the normalized rise a in the zero crossing of the oscillation for this purpose. This is the first derivative of the voltage waveform divided by the circular frequency $$a = \frac{u'_{(to)}}{\omega} \quad (7)$$

Other methods may also be used to determine the Q-factor.

Extensions to the Method of Numerical Evaluation

A number of other solutions are also used in the course of development of the evaluation algorithm. In this case, reference is always made to the voltage waveform u(t). The principles can likewise also be applied to the use of the current signal i(t).

1. Alternatively, the current and voltage can also be recorded simultaneously. This results in a complex signal v̄(t) for further evaluation.

2. Formation of the first u'(t) and second derivative u"(t) of the signal u(t). These functions can be used advantageously not only for determining the zero crossings, but also for calculating the Q-factor. They are required in any case in order to determine these parameters for quarter periods (see below in paragraph 4).

3. Consideration of the non-linearities of the arc. When this method is used, an arc always occurs at the fault location. The resistance of this arc is dependent on the current and thus rises as the oscillation decays exponentially. As a consequence, however, the Q-factor and hence also the measurable oscillation frequency also vary. The Thomson frequency is calculated in sections, preferably between zero crossings, for correction. In these short time periods, the arc resistance is approximately constant. In addition, the discrepancies in the Thomson frequencies in the various intervals are also calculated for monitoring purposes, and the mean value of the frequencies is formed for the overall result.

4. Quarter periods.

In the case of objects with a very low Q-factor (<1.5), the operations are carried out as explained in paragraph 1. In addition, other times are also determined in order to make it possible to calculate the oscillation frequency:

Start of the current flow to (sudden change in u"(t))

Maximum of the current flow t2 (zero crossing of u"(t))

First zero crossing of the voltage u(t) t3

Mid-time of the imaginary half-period t1.

Using this method, the frequency and Q-factor can also be determined if the decaying oscillation t0 starts with a delay (when there is a delay in the striking of the fault arc).

5. Filtering and Extrapolation

Low-pass filtering before the final measurement of the frequency and Q-factor is expedient in order to suppress noise and interference components in the recorded measurement signal. The filter bandwidth may be adaptively matched to the measurement signal that is present. In order to ensure the correct effect of non-causal filtering of the measurement signal (for example linear phase filtering, transversal filtering), the measurement signal to be filtered may be extrapolated in the time periods before the striking of a fault arc (to, see above, paragraph 4) and after the quenching of a fault arc using previously obtained estimated values of the frequency and of the Q-factor.

Separation of the Impulse Capacitor from the Cable Capacitance

When using the method in the medium-voltage range, other influences occur which mean that the method needs to be extended. In the low-voltage range, it may generally be assumed that, for realistic cable lengths (of less than 1 km), the cable capacitance can be ignored in comparison to the capacitance of the impulse capacitor. Normally, the error is less than 1%. In the medium-voltage range, the voltages which are used are higher (normally above 32 kV), and the capacitance for comparable impulse energies is thus less. Normally, the capacitance values are between 2 and 5 µF. Furthermore, the maximum lengths of medium-voltage cables are greater. A 20 kV VPE cable of 150 mm² and with a length of 5 km has a capacitance of 1.25 µF, and is therefore in the same order of magnitude as the impulse capacitor.

The line inductance can therefore no longer be calculated from the measured frequency and the known value of the impulse capacitor. The cable capacitance $C_k$ is added to the impulse capacitance $C_s$, and thus likewise influences the frequency. The length, or to be more precise, the distance to the fault, is unknown, however, so that this influence cannot be eliminated easily either.

Separation is therefore impossible because there are two unknowns (cable capacitance and line inductance Lk) but only one equation (8) for determining the circular frequency ω.

$$\omega^2 = \frac{1}{(C_s + C_k)L_k} \quad (8)$$

$$\omega^2 = \frac{1}{(C_s + C_k)L_k} \quad (8a)$$

Of course, there are many known derivations of equation (8a). For example, derivations include the following equations (8b):

$$\omega_0 = 2\pi f_0 = \frac{1}{\sqrt{LC}} \text{ or } f_0 = \frac{1}{2\pi\sqrt{LC}} \quad (8b)$$

These equations/derivations (8a), (8b) are well known as "Thomson's Formula" or "Thomson's Resonant Circuit Formula."

A second determining equation is required. A second measurement could be taken for this purpose using a different impulse capacitance. However, this would involve considerable complexity since the capacitors would have to be switched, and the switches required in this case for a high voltage and high pulse currents have long switching times and are costly. Furthermore, capacitors which can be split are required and two measurements must be carried out in order to achieve a result. However, in the case of flashover faults, it is not always certain that two successful measurements can be carried out successively.

A different approach is thus adopted. The separation can be achieved by inclusion of a priori information about the measurement object, specifically the cable characteristics.

The cable inductance and capacitance are known characteristics and are listed in the engineering data from the manufacturers as the line data. The inductive line data for the cable is required in any case in order to convert the cable inductance to a fault distance. A cable table, from which the user selects the particular cable type, is stored in the appliance for this purpose. This cable table has the capacitance data added to it. The cable impedance can therefore be calculated using equation (9)

$$Z_k = \sqrt{\frac{L_k}{C_k}} = \sqrt{\frac{L'}{C'}} \quad (9)$$

where L' and C' represent the line data for the cables.

The cable impedance $Z_k$ can be substituted for the cable capacitance in equation (8) (10).

$$\omega^2 = \frac{1}{\frac{L_k^2}{Z_k^2} + L_k C_s} \quad (10)$$

Apart from $L_k$, this equation (10) contains only known variables and can be solved for $L_k$.

$$L_k = \frac{Z_k^2}{2}\left(\sqrt{C_s^2 + \frac{4}{Z_k^2 \omega^2}} - C_s\right) \quad (11)$$

Cs=2 µF, SWG 1000C-1 in the position 32 kV, VPE 20 kV 150 mm², Zk=38 Qf=5, 48 kHz for a 1 km cable, f=13 kHz for 200 m The tabulated cable impedance therefore makes it possible to eliminate the ambiguity, and to calculate the cable inductance, from only one measurement.

The invention will be explained in more detail in the following text, with reference to drawings in which a number of embodiment approaches are illustrated. In this case, further features and advantages of the invention will become evident from the drawings and from their description.

In the drawings:

FIG. 7: shows the Chirp-Z-transformed curve from FIG. 6, FIG. 8: shows the same curve as in FIG. 7, using a Hanning window as shown in FIG. 9, FIG. 9: shows the Hanning window for use in FIG. 8, and FIG. 10: shows a schematic diagram of an evaluation circuit for carrying out the method.

First of all, it should be mentioned that, in the present invention, not only is protection claimed for the method, but, independently of this, protection is also claimed for the circuit that is used.

It should be mentioned that the essential feature of the invention is that the inductance of the measured cable network is used as an evaluation criterion, because this inductance is independent of the branches.

This therefore results in the advantage that high-frequency evaluation signals can no longer adversely affect the measurement.

Figure 1:
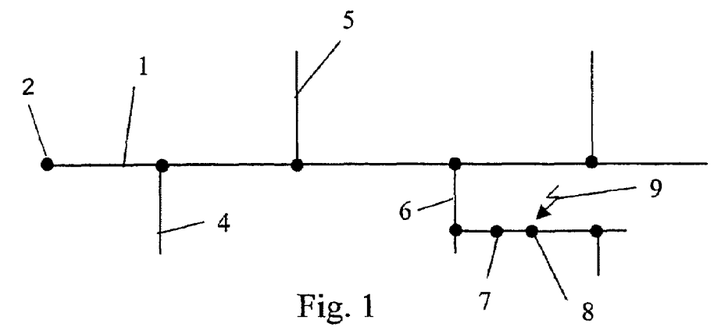
FIG. 1: shows a schematic diagram of a cable network with branches.

FIG. 1 shows a schematic diagram of a cable network to be evaluated, with a voltage-dependent fault 9 at the fault location 8.

The cable network essentially comprises a main line 1 to which the measurement arrangement is connected at a connecting point 2.

Figure 2:
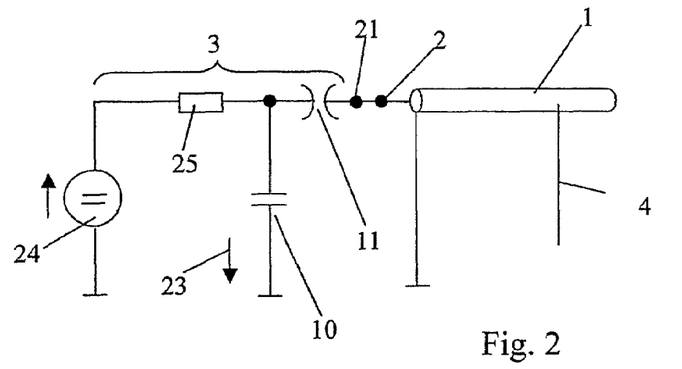
FIG. 2: shows a schematic diagram of an impulse wave generator connected to a cable network as shown in FIG. 1, FIG. 3: shows an evaluation of a current diagram from the cable network at the position 23 in FIG. 2, FIG. 4: shows an evaluation of a voltage diagram at the position 22 in FIG. 2, FIG. 5: shows an evaluation of the same voltage diagram, showing the measurement points for frequency determination.

The measurement arrangement essentially comprises the impulse wave generator 3 as illustrated in FIG. 2, which has a high-voltage source 24 with an internal resistance 25, and an impulse capacitor 10 associated with it. The voltage which is produced in this way is discharged suddenly via the spark gap 11.

The impulse wave is fed via the connecting point 2 into the main line 1, which has two or more branches 4, 5, 6, and in which case the fault location 8 may even be located in a secondary branch 7 of the branch 8.

Figure 3:
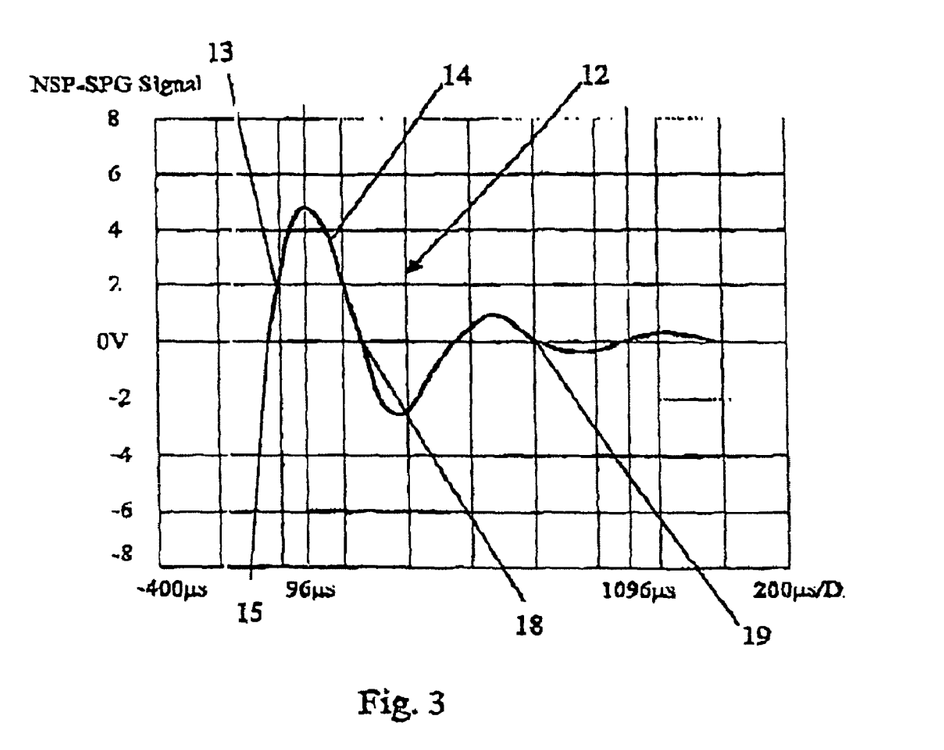

FIG. 3 shows the evaluation of the current diagram, as can be determined by means of an appropriate tap at the foot point of the position 23.

The impulse wave voltage is discharged at the position 15, leading to the current rise, and, as can be seen, this damped oscillation 12, which is fed backward to the main line 1 from the fault location 8, also contains a high-frequency component 13. According to the invention, this high-frequency component 13 is actually not now evaluated, but only the low-frequency oscillation 14 of the damped oscillation 12 overall.

This therefore results in the advantage that the high-frequency component 13 is no longer included in the measurement result.

By way of example, according to the invention, the period duration is now determined between the positions 18 and 19.

Figure 10:
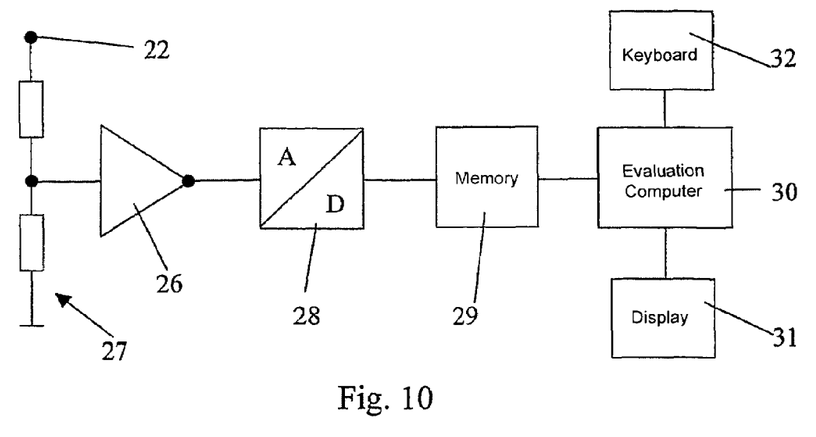

Alternatively, instead of evaluating the current diagram at the position 23, the voltage diagram can also be determined as a tap at the positions 21 (FIG. 2) or 22 (FIG. 10).

Figure 4:
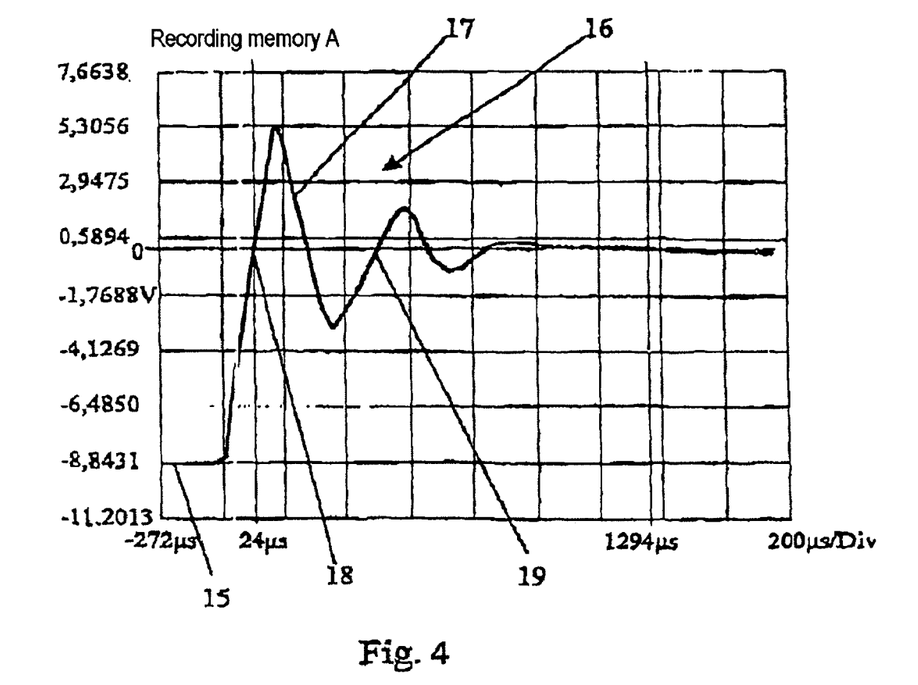

A damped oscillation 16 also occurs in this voltage diagram as shown in FIG. 4, and its low-frequency oscillation 17 is evaluated. The evaluation may in this case likewise be carried out between the positions 18 and 19.

Figure 5:
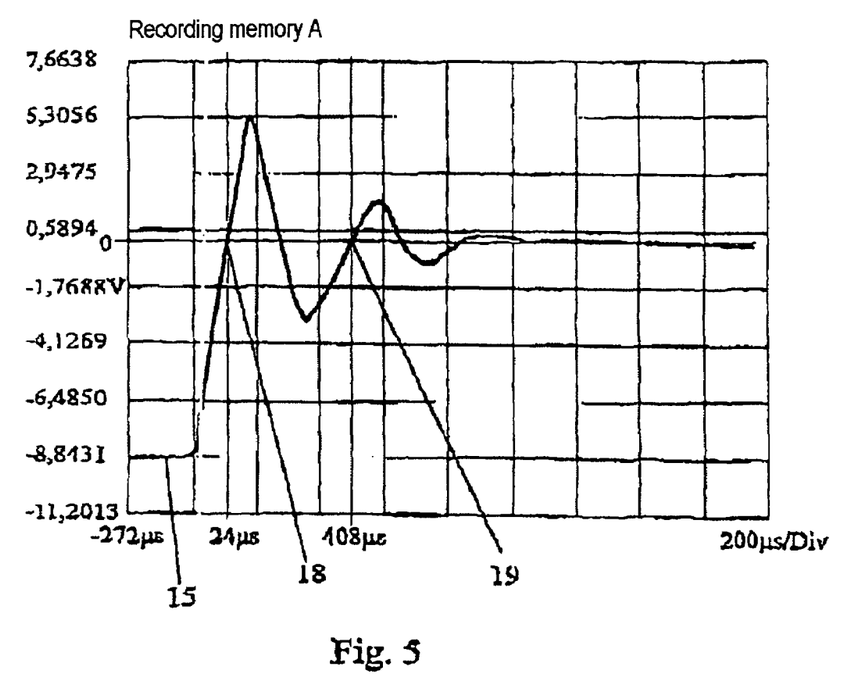

FIG. 5 essentially shows the same curve, with a detailed explanation once again being provided of how the evaluation is carried out.

The oscillation frequency is therefore determined via the zero crossings of the damped oscillation.

Alternatively, a further calculation process is also carried out, as is shown in FIGS. 6-9.

First of all, however, the further evaluation method will be explained in more detail.

Calculation of the cable inductance from the measured period duration τp $$f:=1/\tau p \quad (1)$$

$$\omega:=2\pi f \quad (2)$$

$$Lo:=1/C\omega^2 \quad (3)$$

The self-inductance of the SWG part and of the measurement lines must then also be subtracted from the calculated inductance Lo. This is about 5.1 µH in the 1 kV range.

An exemplary embodiment of this calculation will be described in the following text.

On the NSP demonstration path, the period duration measured in the 4 kV range for the spark gap is 388 µs.

This results in an oscillation frequency of 2.58 kHz. The impulse capacitor in the master appliance 1 has a capacitance of 129 µF in the 4 kV position.

The total inductance is calculated from this to be 29.4 µH. Subtracting the self-inductance of the SWG and of the measurement line of 5.4 µH, the cable inductance is 23.8 µH.

An NAYY 4*−50 cable has 457 µH/km in a measurement between the blue and yellow/green. Measured between the blue and yellow/green conductors, it is about 365 µH·km. During the evaluation process, it is therefore necessary to decide whether the conductors are opposite or adjacent.

This results in a fault distance of 23.8/457=0.052 km or 52 m.

In an alternative evaluation method, the evaluation is carried out by calculating the Fourier-transformed damped oscillation.

A Chirp-Z transformation is therefore used.

Figure 6:
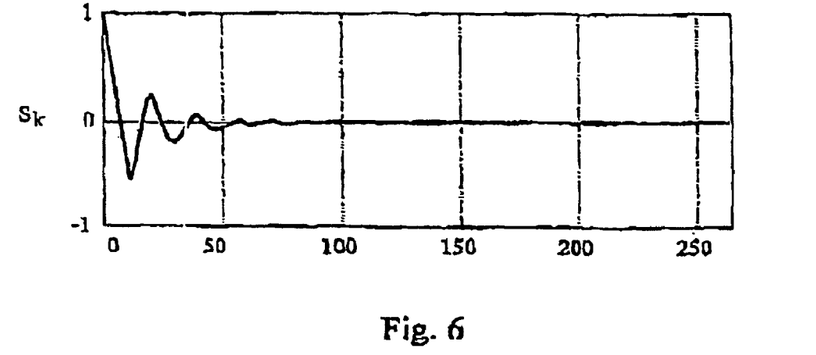
FIG. 6: shows a schematic voltage diagram, similar to that in FIG. 5, at the position 22.

FIG. 6 shows a time signal, as is also illustrated in the same manner in FIGS. 4 and 5, but with a positive polarity being shown.

Figure 6A:
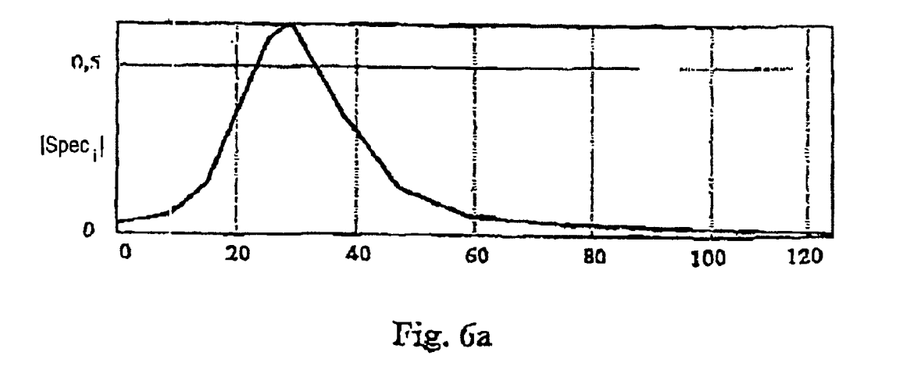

The Fourier-transformed curve from FIG. 6 is illustrated in FIG. 6a.

Figure 7:
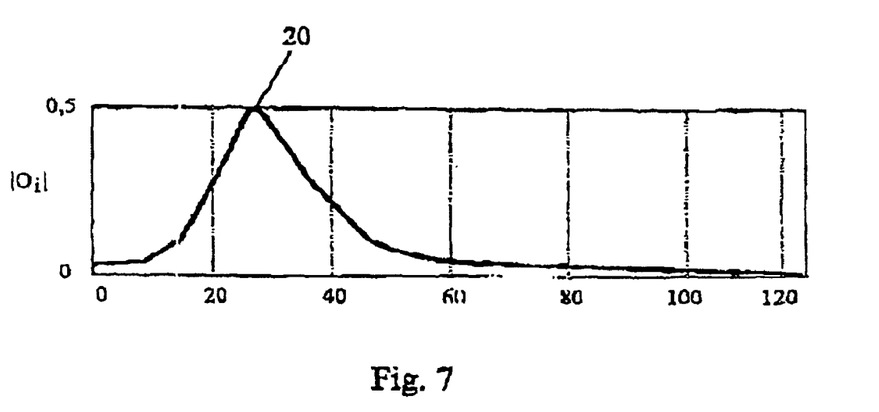

Rather than the Fourier-transformed curve as shown in FIG. 6a, the Chirp-Z-transformed curve as shown in FIG. 7 is now determined according to the invention.

Both calculation methods are, however, claimed as being significant to the invention, that is to say both the Fourier-transformed curve as shown in FIG. 6a and the Chirp-Z-transformed curve are in each case used as alternatives for calculation.

To be more precise, this is an FFT calculation as shown in FIG. 6a.

Figure 8:
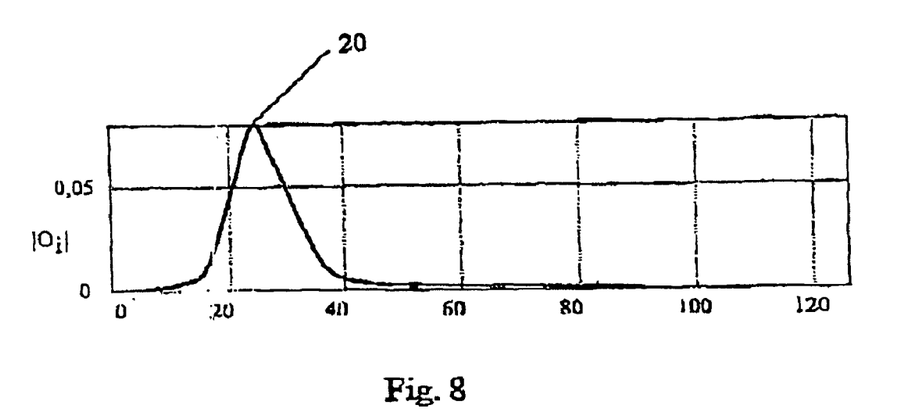

Now, according to the invention, the frequency maximum is determined at the position 20 in the curve shown in FIG. 7 and FIG. 8, and the frequency maximum at the position 20 then again indicates the oscillation frequency. In the case of a highly-damped oscillation, improved evaluation is obtained by using a so-called Hanning window. This Hanning window is shown in FIG. 9.

Figure 9:
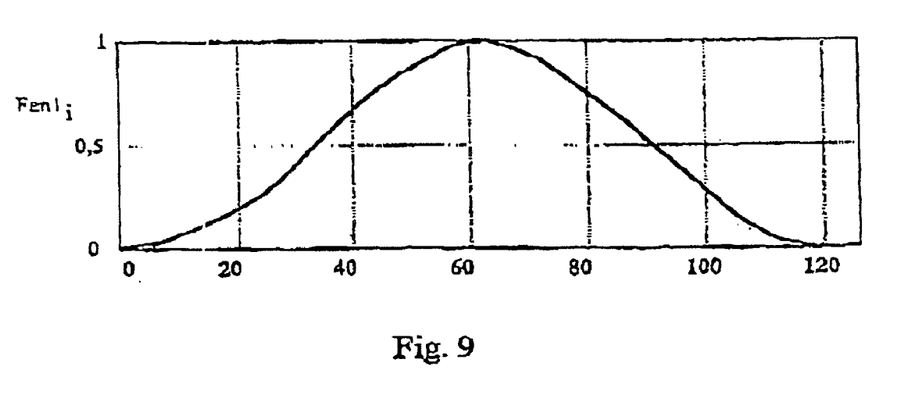

The process of determining the maximum as shown in FIG. 8 is simplified by use of the Hanning window as shown in FIG. 9. The evaluation by means of the Hanning window as shown in FIG. 9 has thus already been implemented in FIG. 8.

First, according to the invention, the input signal is weighted with a Hanning window, and then leads to the evaluation in the curve in FIG. 8.

Instead of the Hanning window shown here, it is also, of course, possible to use other window functions as well in order to improve evaluation, such as a Hanning window or Blackman window or the like.

FIG. 10 shows an evaluation circuit which is generally intended to enjoy independent protection to that of the above-mentioned method.

The amplifier 26 is connected via a voltage divider 27 at the position 22 in FIG. 2.

When a current curve is tapped off, there is no need for the voltage divider 27, and the input of the amplifier 26 is directly connected to a corresponding current connection, for example at 23 in FIG. 2.

The amplifier 26 interacts with an A/D converter 28, which digitizes the low-frequency oscillation 14, 17 of the damped oscillation 12, 16.

The digitized values are stored in a digital memory 29, and are supplied to an evaluation computer 30. The evaluation computer 30 then carries out the two calculation processes either as shown in FIGS. 3-6 or alternatively, as shown in FIGS. 6-9.

The length is also, of course, calculated in this evaluation computer 30, and the result can be output on a display 31.

Appropriate input values can be entered via a keyboard 32.

The important feature of the evaluation circuit shown in FIG. 10 is its simple design, because only the low-frequency oscillations 14, 17 need be evaluated. The evaluation process is carried out automatically after entering the cable locations fully automatically. The voltage-dependent fault 9 at the fault location 8 is thus determined fully automatically.

With regard to the advantages which have been mentioned in the general part, it has also been stated, inter alia, that an evaluation of the flashovers to ground can be identified, and that the user can be warned of dangers. The meaning of this is as follows:

During the evaluation of the oscillation waveform according to the invention, an aperiodic transient process occurs rather than a damped oscillation in the event of a ground flashover. When the measurement signal is evaluated, this aperiodic transient process can be identified and warning information can be produced for the user, because even aperiodic transient processes such as these can be identified and evaluated by the circuit according to the invention.

In summary, the invention therefore relates to a method for fault tracing in branching low-voltage and medium-voltage networks and to an evaluation circuit which is suitable for this purpose, with the method comprising the following steps.

First of all, the frequency of the low-frequency component of the impulse wave current or voltage is determined; the "Thomson's resonant circuit formula" is then used to calculate the circuit inductance from the determined low-frequency transient frequency, the self-inductance of the impulse capacitor and of the measurement line is then subtracted as a correction factor and, finally, the distance to the fault location of the cable fault is calculated from the calculated inductance on the basis of the inductance of the measurement object.

The evaluation process can be carried out step-by-step, as described. However, it is also possible to combine the steps and to calculate the cable length by means of a formula which includes only the measured time duration and the inductance.

The advantage in this case is that, even in the case of a branching low-voltage or medium-voltage network, voltage-dependent cable faults can be traced quickly and without error by means of a length determination process, without any signal reflections on branches or end points of the cables causing interference.

The evaluation circuit has a conditioning and protection module, and A/D converter and at least one memory, as well as an evaluation computer for the signal.

DRAWING LEGEND

1 Main line
2 Connecting point
3 Impulse wave generator
4 Branch
5 Branch
6 Branch
7 Secondary branch
8 Fault location
9 Voltage-dependant fault
10 Impulse capacitor
11 Spark gap
12 Damped oscillation (current diagram)
13 High-frequency component (not evaluated)
14 Low-frequency oscillation (evaluated)
15 Position
16 Damped oscillation (voltage diagram)
17 Low-frequency oscillator
18 Position
19 Position
20 Position
21 Position (tap with voltage divider)
22 Position (tap with voltage divider)
23 Position (current measurement)
24 High-voltage source
25 Internal resistance
26 Amplifier
27 Voltage divider
28 A/D converter
29 Memory
30 Evaluation computer
31 Display
32 Keyboard

The invention claimed is:

1. A method for fault tracing in branched low-voltage and medium-voltage networks by use of an impulse signal generated using an impulse capacitor, comprising:
   a) determining a frequency of a low-frequency component of an impulse wave current or voltage of the impulse signal;
   b) calculating a circuit inductance using a known capacitance of the impulse capacitor and the determined frequency of the low-frequency component;
   c) determining a corrected calculated circuit inductance by subtracting from the calculated circuit inductance a self-inductance of the impulse capacitor and of a measurement line as a correction factor;
   d) calculating a distance to a fault location of a cable fault from the corrected calculated circuit inductance and an inductance of a measurement object.

2. The method as claimed in claim 1, wherein the frequency is evaluated manually or automatically by at least one measurement technique including, for example, by measurement of intervals between zero crossings and/or between extreme (minimum/maximum) values.

3. The method as claimed in claim 2, wherein the frequency is evaluated by use of FFT (Fast Fourier Transform) and/or CZT (Chirp-Z transformation).

4. The method as claimed in claim 3, wherein the extreme maximum value is determined in the FFT and/or CZT representation.

5. The method as claimed in claim 2, wherein the zero crossings are determined in order to check an oscillation frequency for fault identification during an evaluation process.

6. The method as claimed in claim 1, wherein transient components of the impulse wave current or voltage are low-pass filtered.

7. The method as claimed in claim 1, wherein a continuity check is carried out on the signal in order to identify spurious elements and intermittently burning fault arcs.

8. The method as claimed in claim 1, wherein a circuit Q-factor is determined from an amplitude attenuation in order to assess an arc quality.

9. The method as claimed in claim 1, wherein ground faults or a flashover to ground are identified from the impulse signal, and a safety warning is derived for a user.

10. The method as claimed in claim 1, wherein an exceptional treatment process is carried out on faulty signals or signals with high attenuation.

11. The method as claimed in claim 1, wherein, after conditioning and protection by use of at least one electrical module, the signal is recorded by use of at least one A/D converter, and is stored in at least one digital memory during a storage process.

12. The method as claimed in claim 11, wherein an initiation of an impulse signal results in a trigger signal being produced, which stops the data recording process after a delay time.

13. The method as claimed in claim 12, wherein the storage process is started only once a trigger event has been identified.

14. The method as claimed in claim 1, wherein the capacitance of the impulse capacitor and/or equipment-specific self-inductances and/or at least tabular values of the inductance of the measurement objects and/or lengths and type of sections of cables are stored and can be called up in a memory in an evaluation circuit.

15. The method as claimed in claim 14, wherein the equipment-specific self-inductance is determined by a calibration measurement, by a short circuit at end of measurement lines.

16. The method as claimed in claim 1, wherein a Q-factor of a transient response is determined, and a calculation of the measurement line inductance or of the measured frequency or period duration is corrected.

17. The method as claimed in claim 16, wherein the Q-factor of the transient response or of a resonant circuit is determined from a drop in amplitudes of successive oscillations of exponentially decaying transient signal, and/or by a normalized rise in a zero crossing of an oscillation which represents a first derivative of a voltage waveform divided by a circular frequency.

18. The method as claimed in claim 17, wherein the frequency is evaluated by simultaneous recording of the current and voltage, and a complex time-dependent signal obtained in this way is used for further evaluation.

19. The method as claimed in claim 18, wherein, in the case of objects with Q-factor less than 1.5, other times are also determined in order to allow calculation of the oscillation frequency, specifically a start of current flow or sudden voltage change of the output and/or a maximum of the current flow or zero crossing of u"(t) and/or a first zero crossing of the voltage and/or the mid-time of an imaginary half-period.

20. The method as claimed in claim 18, wherein the oscillation frequency is evaluated by determining zero crossings of first and second mathematical derivative with respect to time, and these zero crossings can also be used to determine the Q-factor of the transient response or of the resonant circuit.

21. The method as claimed in claim 18, wherein the oscillation frequency is evaluated by calculation of a Thomson frequency in steps, preferably between short time periods of zero crossings, where an arc resistance is approximately constant and, in addition, discrepancies in the Thomson frequencies in sections are also calculated for monitoring, and a mean value of the frequencies is formed for the overall result.

22. The method as claimed in claim 18, wherein noise and interference components in the recorded measurement signal are suppressed by low-pass filtering before a final measurement of the frequency and Q-factor, with a filter bandwidth being adaptively matched to a measurement signal that is present.

23. The method as claimed in claim 22, wherein, in order to ensure a correct effect of non-causal filtering of the measurement signal, the measurement signal to be filtered is extrapolated in time periods before striking of a fault arc and after quenching of a fault arc using estimated values, obtained in advance, of the frequency and of the Q-factor.

24. The method as claimed in claim 23, wherein cable inductance is calculated using only one measurement with aid of a tabulated cable impedance, with this correction being carried out only when the capacitance of the measurement object in comparison to the capacitance of the impulse generator cannot be ignored.

25. The method as claimed in claim 24, wherein a tabulated cable impedance is calculated by use of a cable table, which has capacitance data added to it, and is stored in the appliance.

26. The method as claimed in claim 1, wherein the circuit inductance is calculated using a predetermined formula.

27. The method as claimed in claim 26, wherein the predetermined formula is derived from a formula used to determine a resonant frequency of an LC circuit.

28. The method as claimed in claim 27, wherein the predetermined formula is referred to as "Thomson's formula" and is expressed:

$$fo = \frac{1}{2\pi\sqrt{LC}}.$$

* * * * *